(12) United States Patent
Chen

(10) Patent No.: US 7,649,214 B2
(45) Date of Patent: Jan. 19, 2010

(54) ESD PROTECTION SYSTEM FOR MULTIPLE-DOMAIN INTEGRATED CIRCUITS

(75) Inventor: Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 465 days.

(21) Appl. No.: 11/252,468

(22) Filed: Oct. 17, 2005

(65) Prior Publication Data

US 2007/0085144 A1 Apr. 19, 2007

(51) Int. Cl.
*H01L 23/60* (2006.01)

(52) U.S. Cl. .............. 257/173; 257/E29.263; 257/355; 257/328; 257/546; 257/362

(58) Field of Classification Search .......... None
See application file for complete search history.

(56) References Cited

U.S. PATENT DOCUMENTS

2003/0201457 A1* 10/2003 Lin et al. ............... 257/173
2005/0286186 A1* 12/2005 Chang .................. 361/56

\* cited by examiner

*Primary Examiner*—Minh-Loan T Tran
*Assistant Examiner*—Fei Fei Yeung Lopez
(74) *Attorney, Agent, or Firm*—K&L Gates LLP

(57) ABSTRACT

An integrated circuit system includes a first device in a first power domain, and a second device coupled to the first device in a second power domain. A circuit module is coupled between the first device and a power supply voltage or between the first device and a complementary power supply voltage in the first power domain for increasing an impedance against an ESD current flowing from the first device to the second device during an ESD event.

15 Claims, 4 Drawing Sheets

ESD PROTECTION SYSTEM FOR MULTIPLE-DOMAIN INTEGRATED CIRCUITS

BACKGROUND

The present invention relates generally to integrated circuit (IC) designs, and more particularly to an electrostatic discharge (ESD) protection system for multiple-domain ICs.

A gate oxide of a metal-oxide-semiconductor (MOS) transistor of an IC is very susceptible to damage. The gate oxide may be destroyed by being contacted with a voltage only a few volts higher than a supply voltage of the IC. It is understood that a regular supply voltage is 5.0, 3.3 volts or even lower. Electrostatic voltages from common environmental sources can easily reach thousands, or even tens of thousands of volts. Such voltages are destructive even though the charge and any resulting current are small. For this reason, it is of critical importance to provide the IC with an ESD protection circuit.

An ESD can occur in many forms, for example, when a person touches some of the pads on the IC. This is the same static electricity that may be painfully experienced by a person who walks across a carpet on a dry day and then touches a grounded metal object. When an ESD event occurs, the ESD protection circuit must quickly become conductive so that the electrostatic charge is conducted to ground and is dissipated before it can damage core circuitry of the IC.

An IC may include one or more circuit domains, such as a digital domain and an analog domain. Conventionally, a grounded-gate NMOS (GGNMOS) transistor is implemented in the multiple-domain IC for dissipating the ESD current to ground through an I/O ground rail during a cross-domain ESD event. However, before the GGNMOS transistor can pass the ESD current to the I/O ground rail, the current may find an unexpected path across the multiple domains to ground. As a result, the electronic components disposed along the unexpected path may be damaged by the ESD current. This unexpected damage can occur more frequently as the semiconductor technology advances to nanometer scales.

thus it is desirable to have an ESD protection system that can avoid the ESD current being dissipated through an unexpected path during a cross-domain ESD event.

SUMMARY

The present invention discloses an integrated circuit system for ESD protection. In one embodiment of the present invention, the system includes a first device in a first power domain, and a second device coupled to the first device in a second power domain. A circuit module is coupled between the first device and a power supply voltage or between the first device and a complementary power supply voltage in the first power domain for increasing an impedance against an ESD current flowing from the first device to the second device during an ESD event.

The construction and method of operation of the invention, however, together with additional objects and advantages thereof will be best understood from the following description of specific embodiments when read in connection with the accompanying drawings.

DESCRIPTION

Figure 1:
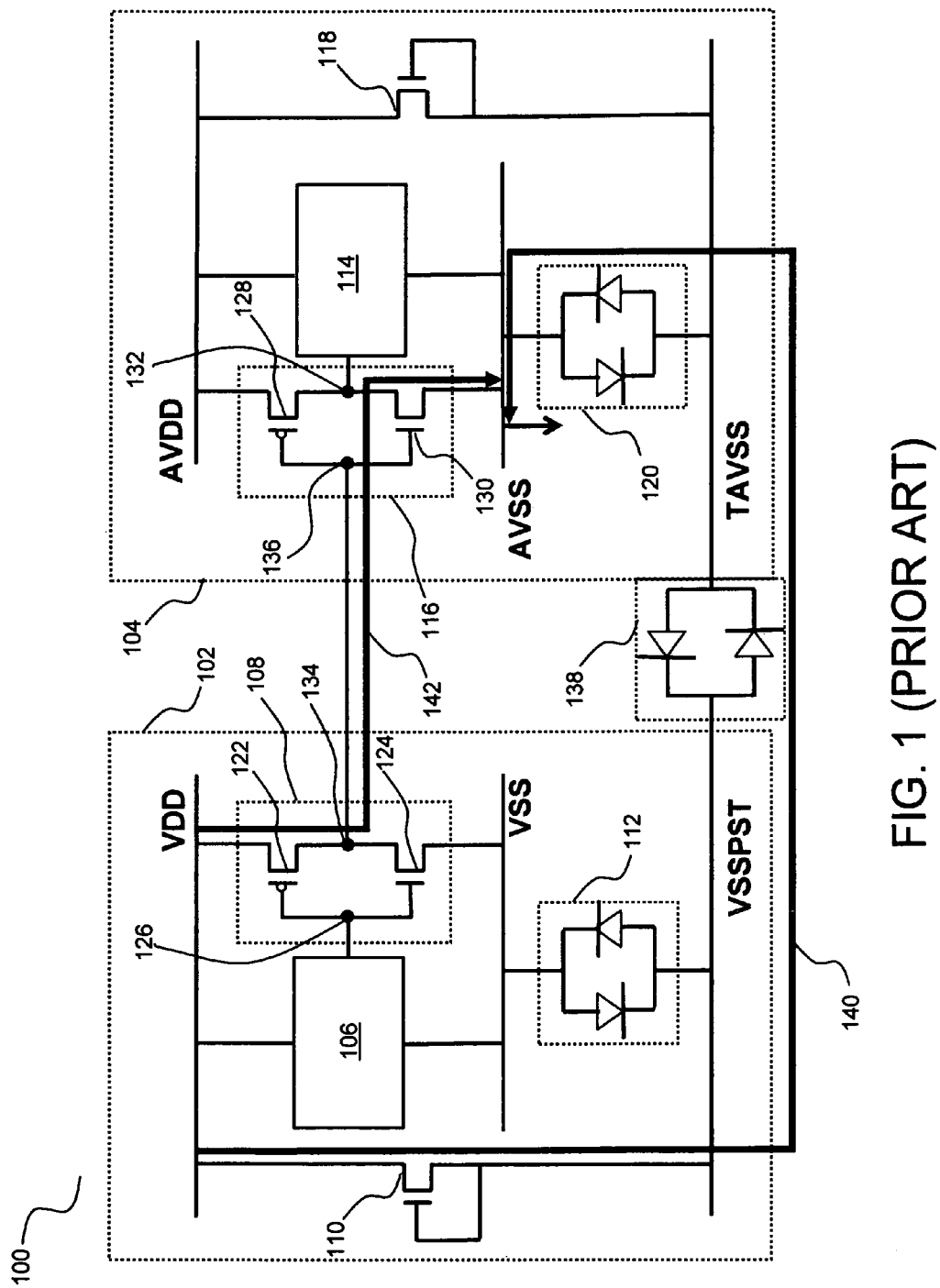
FIG. 1 illustrates a circuit diagram showing a conventional cross-domain ESD protection system.

FIG. 1 illustrates a circuit diagram 100 showing a conventional cross-domain ESD protection system, which includes a digital domain 102 and an analog domain 104. The digital domain 102 includes a digital core circuit 106, an inverter 108, a GGNMOS transistor 110, and a set of diodes 112, while the analog domain 104 includes an analog core circuit 114, an inverter 116, a GGNMOS transistor 118, and a set of diodes 120.

In the digital domain 102, the inverter 108 that includes a PMOS transistor 122 and an NMOS transistor 124 is connected to the core circuit 106 through its input node 126. The drain of the GGNMOS transistor 110 is coupled to the supply voltage VDD, while the source and the gate of the transistor 110 are both coupled to the I/O ground rail VSSPST in the digital domain 102. The analog domain 104 is arranged in a similar fashion. The inverter 116 includes a PMOS transistor 128 and an NMOS transistor 130, and the analog core circuit 114 is coupled to the inverter 116 at its output node 132. Like the digital domain 102, the analog domain 104 also has the GGNMOS transistor 118 for ESD protection. The two domains 102 and 104 are coupled together by connecting a node 134, which is the output node of the inverter 108, and a node 136, which is the input node of the inverter 116. The I/O ground rail, which includes a first segment VSSPST and a second segment TAVSS coupled by a set of diodes 138, runs through the first and second domains 102 and 104, and connects to the complementary supply voltages VSS and AVSS through the diode sets 112 and 120, respectively.

A current dissipation path 140 is designed to dissipate the ESD current from the supply voltage VDD of the first domain 102 to the complementary supply voltage AVSS of the second domain 104. When the ESD current arrives at the supply voltage VDD, the GGNMOS transistor 110 will be turned on to allow the current to pass to the I/O ground rail VSSPST in the digital domain 102. The ESD current then travels through the diode set 138, the I/O ground rail TAVSS, and the diode set 120 to the complementary supply voltage AVSS in the analog domain 104.

One drawback of the conventional ESD protection system is that the ESD current may find the complementary supply voltage AVSS through an unexpected path. For example, it is possible that the ESD current may flow down an unexpected current path 142 directly from the supply voltage VDD to the complementary supply voltage AVSS through the inverters 108 and 116. As a result, the transistors within the inverters 108 and 116 can be easily damaged during a cross-domain ESD event.

Figure 2:
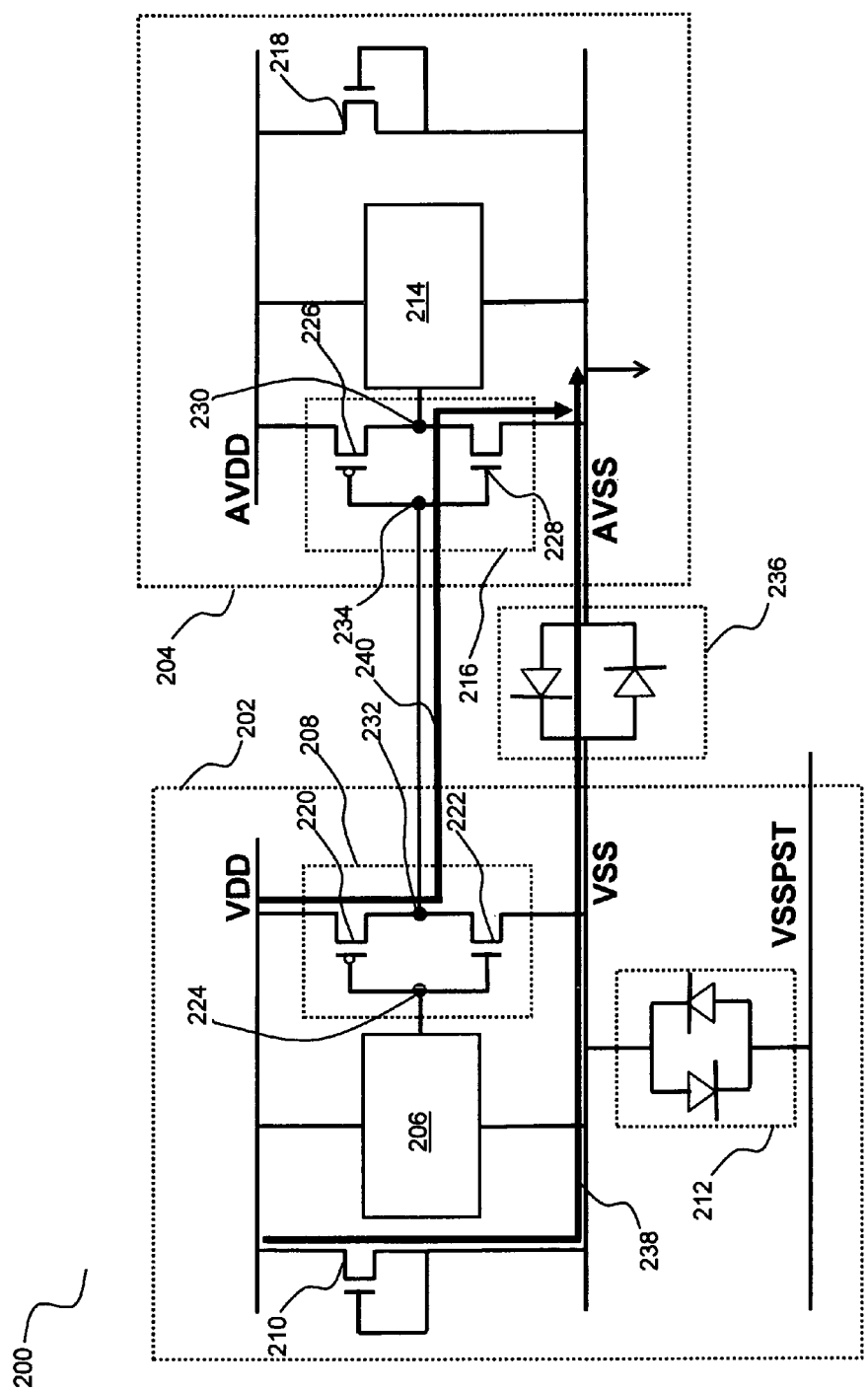
FIG. 2 illustrates a circuit diagram showing a cross-domain ESD protection system in accordance with one embodiment of the present invention.

FIG. 2 illustrates a circuit diagram 200 showing a cross-domain ESD protection system in accordance with one embodiment of the present invention. The ESD protection system as shown by the circuit diagram 200 includes a digital domain 202 and an analog domain 204. The digital domain 202 includes a digital core circuit 206, an inverter 208, a GGNMOS transistor 210, and a set of diodes 212, while the analog domain 204 includes an analog core circuit 214, an inverter 216, and a GGNMOS transistor 218.

In the digital domain 202, the inverter 208 having a PMOS transistor 220 and an NMOS transistor 222 is connected to the core circuit 206 through its input node 224. In this embodiment, the GGNMOS transistor 210 is the ESD protection device. It is designed to turn on during an ESD event to dissipate the ESD current before it damages the core circuit 206. The drain of the GGNMOS transistor 210 is coupled to the supply voltage VDD of the first domain 202, while its source and gate are coupled to the complementary supply voltage VSS, which is further connected to an I/O ground rail VSSPST through the diode set 212. The analog domain 204 is arranged in a similar fashion. The inverter 216 includes a PMOS transistor 226 and an NMOS transistor 228. The analog core circuit 214 is coupled to the output node 230 of the inverter 216. Like the digital domain 202, the analog domain 204 also has the GGNMOS transistor 218 for ESD protection. The two domains 202 and 204 are coupled together by connecting a node 232, which is the output node of the inverter 208, and a node 234, which is the input node of the inverter 216. The complementary supply voltage VSS of the digital domain 202 and the complementary supply voltage AVSS of the analog domain 204 are further connected by conductive means, which may include a set of diodes 236 that are reversely parallel.

A current dissipation path 238 is designed to dissipate the ESD current from the supply voltage VDD of the digital domain 202 to the complementary supply voltage AVSS of the analog domain 204. When the ESD current arrives at the supply voltage VDD, the GGNMOS transistor 210 will be turned on, thereby allowing the current to pass from the supply voltage VDD to the complementary supply voltage VSS. The ESD current would then travel through conductive means, such as the diode set 236, to the complementary supply voltage AVSS of the analog domain 204. Compared to FIG. 1, this current path 238 suffers less noise than the path 140 that utilizes the I/O round rail. The GGNMOS transistor 210 can be turned on more easily, thereby reducing the possibility of having the ESD current traveling through an unexpected path 240 and damaging the inverters 208 and 216.

Figure 3A:
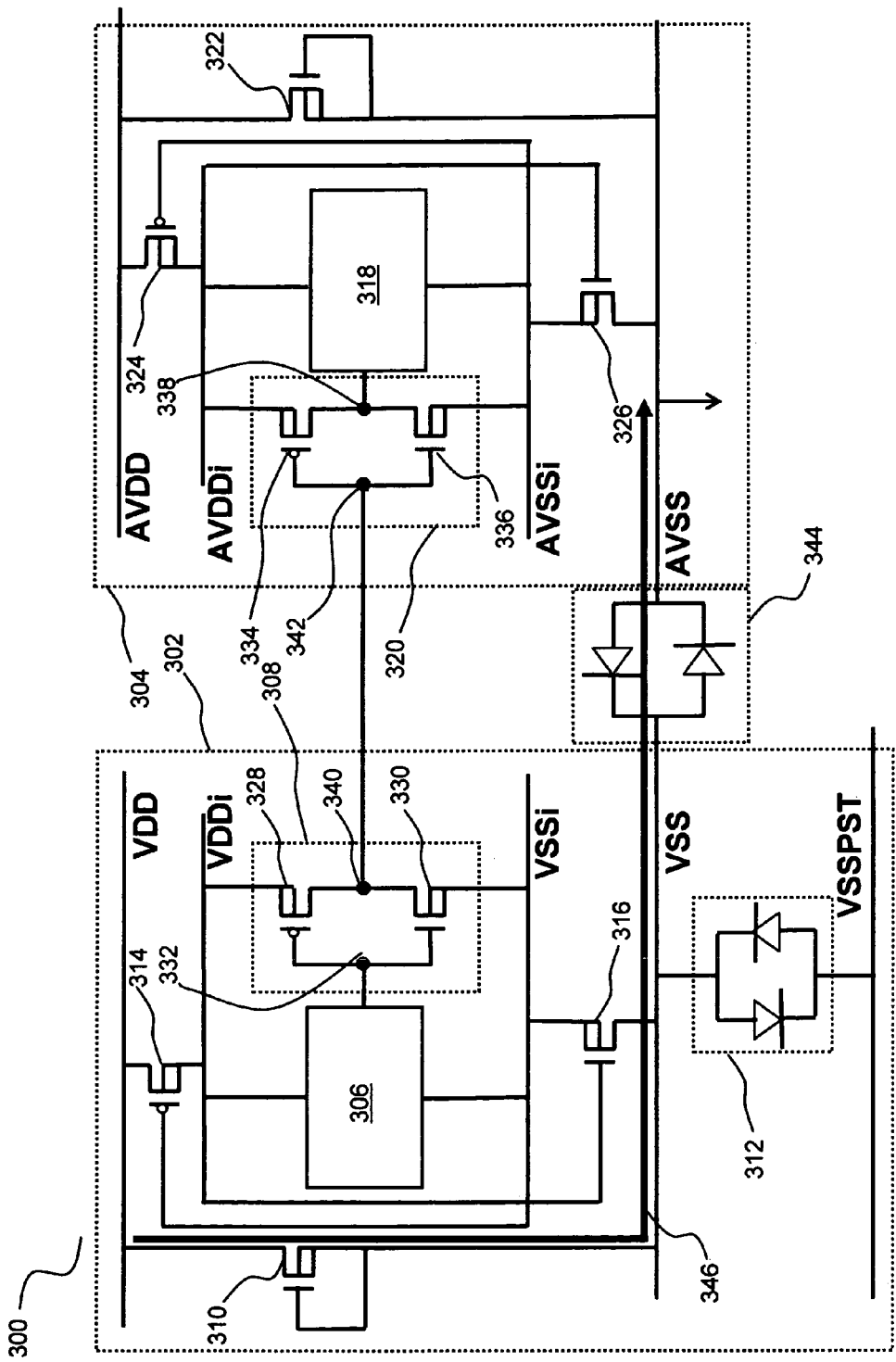
FIG. 3A illustrates a circuit diagram showing a cross-domain ESD protection system in accordance with another embodiment of the present invention.

FIG. 3A illustrates a circuit diagram 300 showing a cross-domain ESD protection system in accordance with another embodiment of the present invention. The ESD protection system illustrated by the circuit diagram 300 includes a digital domain 302 and an analog domain 304. The digital domain 302 includes a digital core circuit 306, an inverter 308, a GGNMOS transistor 310, a set of diodes 312, a header PMOS transistor 314, and a footer NMOS transistor 316. The analog domain 304 includes an analog core circuit 318, an inverter 320, and a GGNMOS transistor 322, a header PMOS transistor 324, and a footer NMOS transistor 326.

In the digital domain 302, the inverter 308 having a PMOS transistor 328 and an NMOS transistor 330 is connected to the core circuit 306 through its input node 332. In this embodiment, the GGNMOS transistor 310 is the ESD protection device. It is designed to turn on during an ESD event to dissipate the ESD current before it damages the core circuit 306. The drain of the GGNMOS transistor 310 is coupled to the supply voltage VDD of the digital domain 302, while the source and the gate of the transistor are coupled to the complementary supply voltage VSS. The header PMOS transistor 314 has its gate tied directly to the internal complementary supply voltage VSSi of the digital domain 302. The footer NMOS transistor 316 coupled between the complementary supply voltage VSS and the internal complementary supply voltage VSSi has its gate connected to the internal supply voltage VDDi of the digital domain 302.

The analog domain 304 is arranged in a similar fashion. The inverter 320 includes a PMOS transistor 334 and an NMOS transistor 336. The analog core circuit 318 is coupled to the output node 338 of the inverter 320. Like the digital domain 302, the analog domain 304 also has a GGNMOS transistor 322 for ESD protection. The header PMOS transistor 324 has its gate tied directly to the internal complementary voltage supply AVSSi of the analog domain 304. The footer NMOS transistor 326 coupled between the complementary supply voltage AVSS and the internal complementary supply voltage AVSSi has its gate connected to the internal supply voltage AVDDi of the analog domain 304. The two domains 302 and 304 are coupled together by connecting a node 340, which is the output node of the inverter 308, and a node 342, which is the input node of the inverter 320. The two domains 302 and 304 are further coupled together by a conductive means, such as a set of diodes 344 coupled in reversely parallel between the complementary supply voltages VSS and AVSS.

A current dissipation path 346 is designed to dissipate the ESD current from the supply voltage VDD of the digital domain 302 to the complementary supply voltage AVSS of the analog domain. As the ESD current appears at the supply voltage VDD, the GGNMOS transistor 310 will be turned on, thereby allowing the current to flow to the complementary supply voltage VSS. The ESD current would then travel through the diode set 344 to the complementary supply voltage AVSS of the analog domain 304. The header PMOS transistor 314 and footer NMOS transistor 326 increase the impedance for the current path from the supply voltage VDD through the inverters 308 and 320 to the complementary supply voltage AVSS. This avoids the possibility that the ESD current travels through such current path during a cross-domain ESD event, thereby protecting the inverters 308 and 320 from being damaged by the same.

It is understood that the header PMOS transistor 324 and footer NMOS transistor 316 can also protect the inverters 308 and 320 when the ESD current appears at the supply voltage AVDD of the analog domain 304. It is noted that the transistors used for the header and footer can be connected in various ways. In this embodiment, the bulks of the PMOS transistors 314 and 324 are connected to the internal supply voltages VDDi and AVDDi, respectively, while the bulks of the NMOS transistors 316 and 326 are connected to the internal complementary supply voltages VSSi and AVSSi, respectively. Alternatively, the bulks of the PMOS transistors 314 and 324 can be connected to the supply voltages VDD and AVDD, respectively, while the bulks of the NMOS transistors 316 and 326 can be connected to the complementary supply voltages VSS and AVSS, respectively.

Figure 3B:
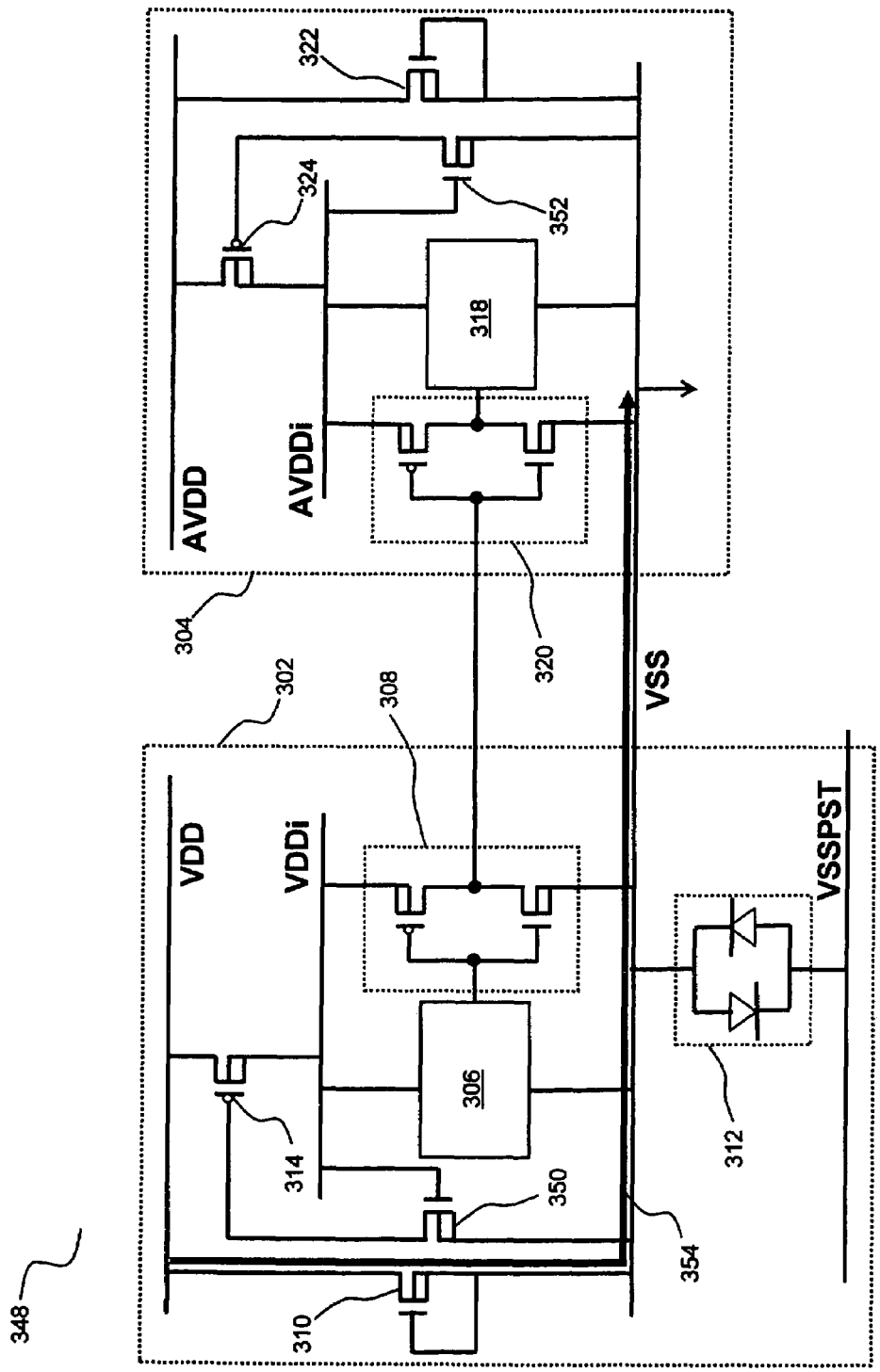
FIG. 3B illustrates a circuit diagram showing a cross-domain ESD protection system in accordance with yet another embodiment of the present invention.

FIG. 3B illustrates a circuit diagram 348 showing an ESD protection system in accordance with yet another embodiment of the present invention. The circuit diagram 348 is similar to the circuit diagram 300 of FIG. 3A as to the presence of the domains 302 and. 304, respectively, having the core circuits 306 and 318, the inverters 308 and 320, and the GGNMOS transistors 310 and 322. The sources of header PMOS transistors 314 and 324 are coupled to the supply voltages VDD and AVDD, respectively. The drains of the header PMOS transistors 314 and 324 are tied respectively to the internal supply voltages VDDi and AVDDi, respectively. The gates of the header PMOS transistors 314 and 324 are coupled respectively to the drains of the footer NMOS transistors 350 and 352 that are designed to be tied low to the complementary supply voltage VSS. The gate of the NMOS transistor 350 is coupled to the internal supply voltage VDDi, while the gate of the NMOS transistor 352 is coupled to the internal supply voltage AVDDi. The header PMOS transistors 314 and 324 are turned on since the gates are coupled to the footer NMOS transistors 350 and 352. The header PMOS transistors 314 and 324 provide impedance that can help to limit the ESD current at the supply voltages VDD and AVDD from reaching the inverters 308 and 320.

As the ESD current enters the supply voltage VDD through a pad during a cross-domain ESD event, the GGNMOS transistor 310 will be turned on, thereby allowing the current at the supply voltage VDD to dissipate to the complementary supply voltage VSS through a current dissipation path 354. Much like the circuit design from FIG. 3A, this circuit is also designed to protect the core circuit 318 of the analog domain 304 when the ESD current arrives at the supply voltage AVDD. The GGNMOS transistor 322 is designed to turn on during a cross-domain ESD event to allow the ESD current to flow down to the complementary supply voltage VSS. The header PMOS transistors 314 and 324 increase the impedance against the ESD current at the power supply during the ESD event, thereby reducing the possibility for the ESD current to flow between the inverters 308 and 320 directly.

It is understood that in another embodiment, a cross-domain ESD protection system can implement footer NMOS transistors coupled to the header PMOS transistors that function as tie-high circuits in a reverse fashion as shown in FIG. 3B. For example, at least one footer NMOS transistor (not shown) can be implemented with a source coupled to the complementary power supply voltage in the power domain 302, and a drain coupled to the inverter 308. At least one footer PMOS transistor (not shown) can be implemented with a source coupled to the power supply voltage in the power domain 302, a drain coupled to a gate of the footer NMOS transistor, and a gate coupled to the drain of the footer NMOS transistor. It is understood that the same configuration of the footer NMOS and PMOS transistors can be implemented in the power domain 304 as well.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit system comprising:
   a first core circuit in a first power domain;
   a first header module coupled between a first power supply voltage and the first core circuit, wherein the first header module includes at least one first PMOS transistor having a source coupled to the first power supply voltage in the first power domain and a drain coupled to the first core circuit;
   a first footer module coupled between a first complementary power supply voltage and the first core circuit, wherein the first footer module includes at least one first NMOS transistor having a drain coupled to the first core circuit and a gate of the first PMOS transistor, a source coupled to the first complementary power supply voltage in the first power domain, and a gate coupled the drain of the first PMOS transistor;
   a first inverter with its input coupled to the first core circuit and its output coupled to a second inverter in a second power domain;
   a second core circuit coupled to the second inverter;
   a second header module coupled between a second power supply voltage separate from the first power supply voltage and the second core circuit for increasing an impedance against an ESD current flowing between the first inverter and the second inverter during an ESD event; and
   a second footer module coupled between a second complementary power supply voltage separate from the first complementary power supply voltage and the second core circuit.

2. The integrated circuit system of claim 1 wherein the source of the at least one first NMOS transistor is further coupled to a first set of diodes.

3. The integrated circuit system of claim 2 wherein the first header module comprises at least one first PMOS transistor having a source coupled to the first power supply voltage in the first power domain, a drain coupled to a gate of the first NMOS transistor, and a gate coupled to the drain of the first NMOS transistor.

4. The integrated circuit system of claim 1 wherein the first power domain and the second power domain are coupled to each other via a second set of diodes.

5. The integrated circuit system of claim 1 wherein the second header module comprises at least one second PMOS transistor having a source coupled to the second power supply voltage in the second power domain and a drain coupled to the second core circuit.

6. The integrated circuit system of claim 5 wherein the second footer module comprises at least one second NMOS transistor having a drain coupled to the second core circuit and a gate of the second PMOS transistor, a source coupled to the second complementary power supply voltage in the second power domain, and a gate coupled to the drain of the second PMOS transistor.

7. The integrated circuit system of claim 6 wherein the second header module comprises at least one second PMOS transistor having a source coupled to the second power supply voltage in the second power domain, a drain coupled to a gate of the second NMOS transistor, and a gate coupled to the drain of the second NMOS transistor.

8. The integrated circuit system of claim 1 further comprises:
   a first ground-gated NMOS (GGNMOS) transistor coupled between the first power supply voltage and the first complementary power supply voltage in the first power domain; and
   a second GGNMOS transistor coupled between the second power supply voltage and the second complementary power supply voltage in the second power domain for dissipating an ESD current.

9. An integrated circuit with an electrostatic discharge (ESD) protection system comprising:
   a first core circuit in a digital domain;
   a first header module coupled between a first power supply voltage and the first core circuit, wherein the first header module includes at least one first PMOS transistor having a source coupled to the first power supply voltage in the digital domain and a drain coupled to the first core circuit;

a first footer module coupled between a first complementary power supply voltage in the digital domain and the first core circuit, wherein the first footer module includes at least one first NMOS transistor having a drain coupled to the first core circuit and a gate of the first PMOS transistor, a source coupled to the first complementary power supply voltage in the digital domain, and a gate coupled to the drain of the first PMOS transistor;

a first inverter with its input coupled to the first core circuit and its output coupled to a second inverter in an analog domain;

a second core circuit coupled to the second inverter;

a second header module coupled between a second power supply voltage separate from the first power supply voltage and the second core circuit for increasing an impedance against an ESD current flowing between the first inverter and the second inverter during an ESD event; and a second footer module coupled between a second complementary power supply voltage in the analog domain and the second core circuit.

10. The integrated circuit of claim 9 wherein the source of the at least one first NMOS transistor is further coupled to a first set of diodes.

11. The integrated circuit of claim 9 wherein the digital domain and the analog domain are coupled to each other via a second set of diodes.

12. The integrated circuit of claim 9 wherein the second header module comprises at least one second PMOS transistor having a source coupled to the second power supply voltage in the analog domain and a drain coupled to the second core circuit.

13. The integrated circuit of claim 12 wherein the second footer module comprises at least one second NMOS transistor having a drain coupled to the second core circuit and a gate of the second PMOS transistor, a source coupled to the second complementary power supply voltage in the analog domain, and a gate coupled to the drain of the second PMOS transistor.

14. The integrated circuit of claim 13 wherein the second header module comprises at least one second PMOS transistor having a source coupled to the second power supply voltage in the analog domain, a drain coupled to a gate of the second NMOS transistor, and a gate coupled to the drain of the second NMOS transistor.

15. The integrated circuit system of claim 9 further comprises:

a first ground-gated NMOS (GGNMOS) transistor coupled between the first power supply voltage and the first complementary power supply voltage in the digital domain; and a second GGNMOS transistor coupled between the second power supply voltage and the second complementary power supply voltage in the analog domain for dissipating an ESD current.

* * * * *